US010510639B2

(12) United States Patent
Yamamoto et al.

(10) Patent No.: US 10,510,639 B2
(45) Date of Patent: Dec. 17, 2019

(54) VEHICLE CONTROL DEVICE

(71) Applicant: AISIN AW CO., LTD., Anjo-shi, Aichi-ken (JP)

(72) Inventors: Yusuke Yamamoto, Okazaki (JP); Riku Kambe, Nagoya (JP)

(73) Assignee: AISIN AW CO., LTD., Anjo-shi, Aichi-ken (JP)

( * ) Notice: Subject to any disclaimer, the term of this patent is extended or adjusted under 35 U.S.C. 154(b) by 0 days.

(21) Appl. No.: 15/749,543

(22) PCT Filed: Sep. 26, 2016

(86) PCT No.: PCT/JP2016/078260
§ 371 (c)(1),
(2) Date: Feb. 1, 2018

(87) PCT Pub. No.: WO2017/051925
PCT Pub. Date: Mar. 30, 2017

(65) Prior Publication Data
US 2018/0226319 A1   Aug. 9, 2018

(30) Foreign Application Priority Data
Sep. 24, 2015 (JP) .................. 2015-186640

(51) Int. Cl.
*H05K 7/14* (2006.01)
*H01L 23/373* (2006.01)
(Continued)

(52) U.S. Cl.
CPC ............ *H01L 23/373* (2013.01); *B60R 16/02* (2013.01); *H01L 23/49513* (2013.01);
(Continued)

(58) Field of Classification Search
CPC . H01L 23/373; H01L 23/36; H01L 23/49513; B60R 16/02; H05K 1/0209; H05K 7/1427; H05K 9/0009
See application file for complete search history.

(56) References Cited

U.S. PATENT DOCUMENTS 5,150,193 A * 9/1992 Yasuhara .......... H01L 23/49503
257/669
2011/0096505 A1* 4/2011 Inoue .................. H01L 23/3675
361/706
(Continued)

FOREIGN PATENT DOCUMENTS

JP   09-298889 A   11/1997
JP   2002-167560 A   6/2002
(Continued)

OTHER PUBLICATIONS

International Search Report of PCT/JP2016/078260 dated Dec. 6, 2016.

*Primary Examiner* — Hoa C Nguyen
*Assistant Examiner* — Keith DePew
(74) *Attorney, Agent, or Firm* — Sughrue Mion, PLLC

(57) ABSTRACT

A vehicle control device (100) includes: a housing (200) made of metal; a substrate (400) housed in the housing (200) and having a mounting surface (401) that faces an inner surface (201) of the housing (200); and an electronic component (501) mounted on the mounting surface (401). An adhesive (601) is disposed between the electronic component (501) and the inner surface (201) of the housing (200). The electronic component (501) has a contact portion (532) that contacts the heat radiation material (601) and a non-contact portion (531) that does not contact the heat radiation material (601). The contact portion (532) and the non-
(Continued)

contact portion (531) are portions of the electronic component (501) on the side facing the inner surface (201) of the housing (200).

9 Claims, 5 Drawing Sheets

(51) Int. Cl.
| | |
|---|---|
| *B60R 16/02* | (2006.01) |
| *H01L 23/495* | (2006.01) |
| *H01L 23/00* | (2006.01) |
| *H05K 1/02* | (2006.01) |
| *H05K 9/00* | (2006.01) |

(52) U.S. Cl.
CPC ........... *H01L 24/48* (2013.01); *H05K 1/0209* (2013.01); *H05K 7/1427* (2013.01); *H05K 9/0009* (2013.01); *H01L 2224/48247* (2013.01)

(56) References Cited

U.S. PATENT DOCUMENTS

| | | | |
|---|---|---|---|
| 2011/0228498 A1* | 9/2011 | Kawai | H05K 7/20854 |
| | | | 361/752 |
| 2014/0268578 A1* | 9/2014 | Dolci | H05K 9/0049 |
| | | | 361/719 |

FOREIGN PATENT DOCUMENTS

| | | | |
|---|---|---|---|
| JP | 2002-185183 A | | 6/2002 |
| JP | 2002167560 A | * | 6/2002 |
| JP | 2004-228162 A | | 8/2004 |
| JP | 2007-005390 A | | 1/2007 |
| JP | 2011-192937 A | | 9/2011 |
| JP | 2011192937 A | * | 9/2011 |
| JP | 2011-258882 A | | 12/2011 |
| JP | 2012-146778 A | | 8/2012 |
| JP | 2012146778 A | * | 8/2012 |

\* cited by examiner

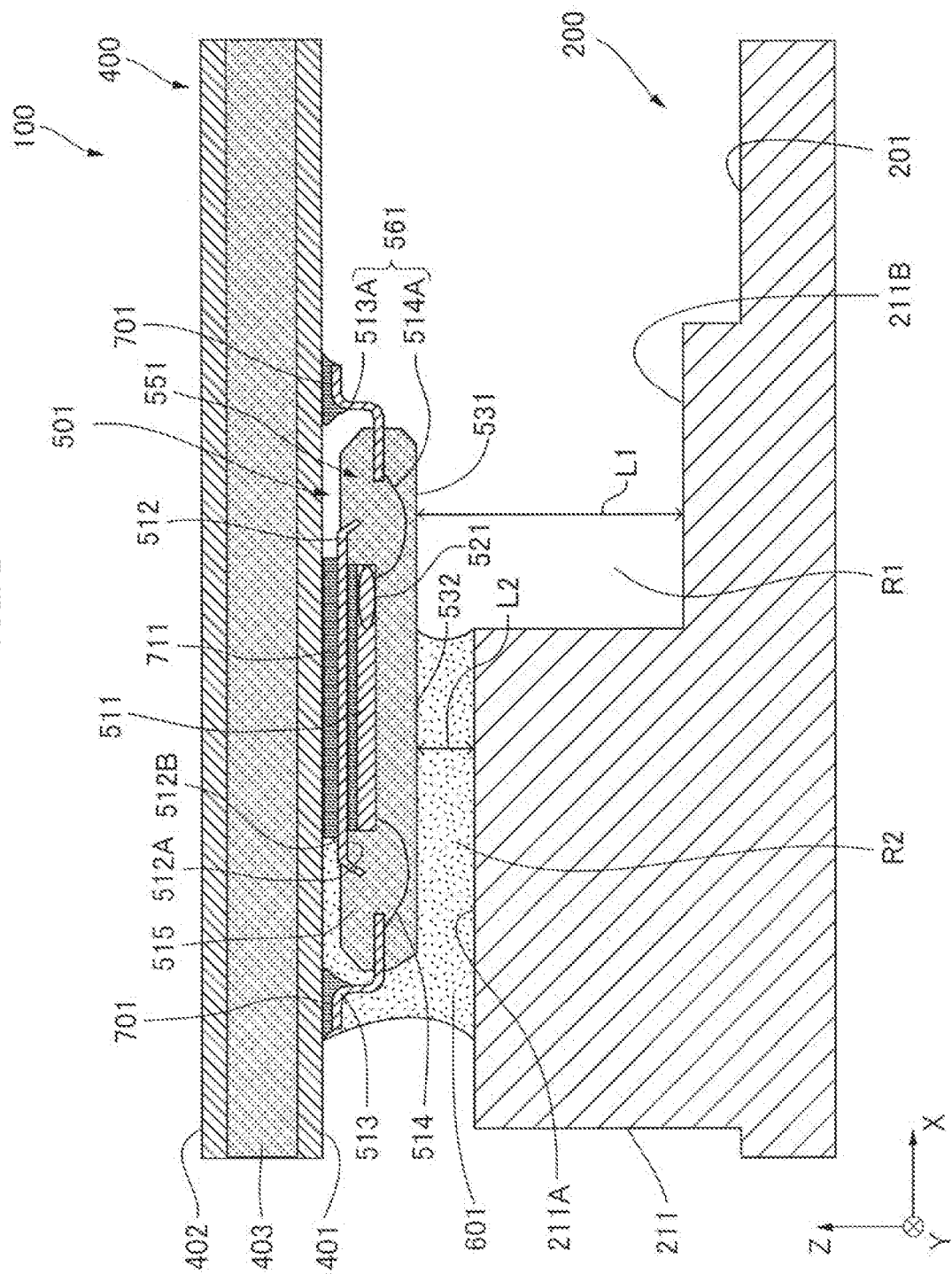

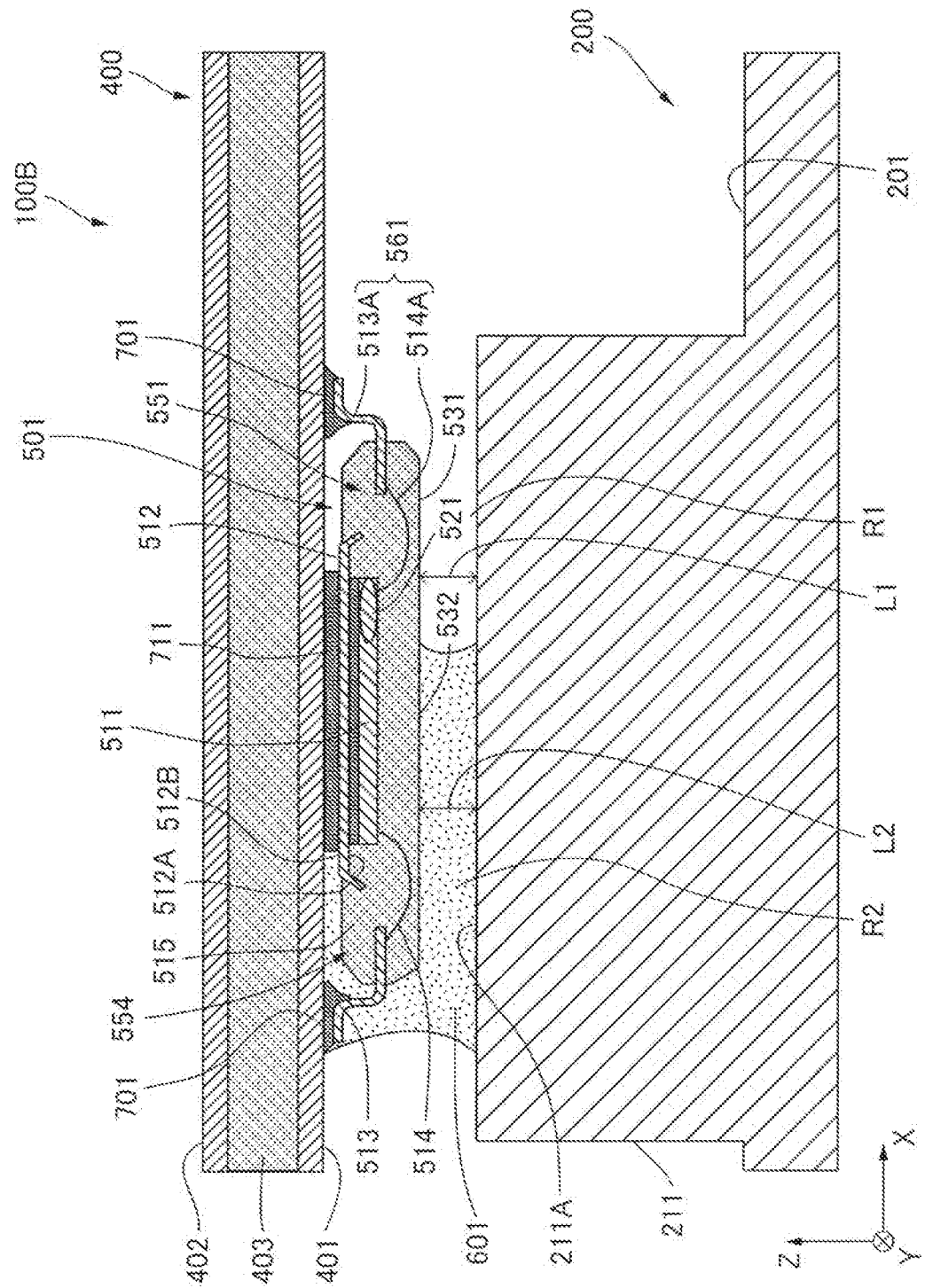

VEHICLE CONTROL DEVICE

CROSS REFERENCE TO RELATED APPLICATIONS

This application is a National Stage of International Application No. PCT/JP2016/078260 filed Sep. 26, 2016, claiming priority based on Japanese Patent Application No. 2015-186640 filed Sep. 24, 2015, the contents of all of which are incorporated herein by reference in their entirety.

TECHNICAL FIELD

This technique relates to a vehicle control device mounted on a vehicle.

BACKGROUND ART

Measures against heat are required for electronic components that control an in-vehicle apparatus mounted on a vehicle, a different electronic component disposed in the same housing, and so forth in order to avoid a reduction in performance due to a temperature rise. A method of radiating heat generated by an electronic component via a substrate on which the electronic component is mounted is generally known as the measures against heat for the electronic components. In the case where the amount of heat radiated from the electronic component is large, however, the size of the substrate must be increased in order to improve the heat radiation performance.

Thus, Patent Document 1 proposes a technique of radiating heat generated by an electronic component to a housing made of metal by bringing the electronic component into contact with the housing via an adhesive in order to reduce the size of the substrate while enhancing the heat radiation performance for the electronic component.

RELATED-ART DOCUMENTS

Patent Documents

Patent Document 1: Japanese Patent Application Publication No. 2004-228162 (JP 2004-228162 A)

SUMMARY

Problem to be Solved by the Invention

However, electromagnetic noise is radiated from an electronic component during operation of the electronic component. Therefore, if an electronic component is bonded to a housing made of metal using an adhesive as in the related art, electromagnetic noise radiated from the electronic component is propagated to the housing via the adhesive, and the noise is easily propagated to an in-vehicle device mounted on a vehicle via the housing. In particular, the adhesive has a higher dielectric constant (relative dielectric constant) than that of air, and the electromagnetic noise which is radiated from the electronic component is easily propagated to the housing via the adhesive. If the adhesive is not used, on the other hand, propagation of the electromagnetic noise to the housing is reduced, but the heat radiation performance for the electronic component is impaired. Such a problem may be caused also in the case where a heat radiation material (such as grease, for example) other than the adhesive is used.

It is therefore an object to reduce propagation of electromagnetic noise radiated from an electronic component to a housing while securing the heat radiation performance for the electronic component.

Means for Solving the Problem

An aspect provides a vehicle control device including:
a housing mounted on a vehicle and made of metal;
a substrate housed in the housing and having a mounting surface that faces an inner surface of the housing;
an electronic component mounted on the mounting surface; and
a heat radiation material disposed between the electronic component and the inner surface of the housing, in which:
the electronic component has a contact portion that contacts the heat radiation material and a non-contact portion that does not contact the heat radiation material, the contact portion and the non-contact portion being portions of the electronic component on a side facing the inner surface of the housing.

Another aspect provides a vehicle control device including:
a housing mounted on a vehicle and made of metal;
a substrate housed in the housing and having a mounting surface that faces an inner surface of the housing;
an electronic component mounted on the mounting surface; and
a heat radiation material disposed in a second region, of a first region and the second region between the electronic component and the inner surface of the housing as seen in a direction that is perpendicular to the mounting surface, in which
a dielectric constant of a substance that is present in the first region is lower than a dielectric constant of the heat radiation material.

Still another aspect provides a vehicle control device including:
a housing mounted on a vehicle and made of metal;
a substrate housed in the housing and having a mounting surface that faces an inner surface of the housing;
an electronic component mounted on the mounting surface; and
a heat radiation material disposed between the electronic component and the inner surface of the housing, in which:
the electronic component has a first portion and a second portion on a side facing the inner surface of the housing; and
a distance between the first portion and the inner surface of the housing in a direction that is perpendicular to the mounting surface is longer than a distance between the second portion and the inner surface of the housing in the direction which is perpendicular to the mounting surface.

Effects of the Invention

With the present vehicle control device, it is possible to reduce propagation of electromagnetic noise radiated from an electronic component to a housing while securing the heat radiation performance for the electronic component.

BRIEF DESCRIPTION OF THE DRAWINGS

FIG. 2 is an enlarged sectional view of a part of the vehicle control device according to the first embodiment.

FIG. 5 is an enlarged sectional view of a part of a vehicle control device according to a third embodiment.

PREFERRED EMBODIMENTS

First Embodiment

Figure 1A:
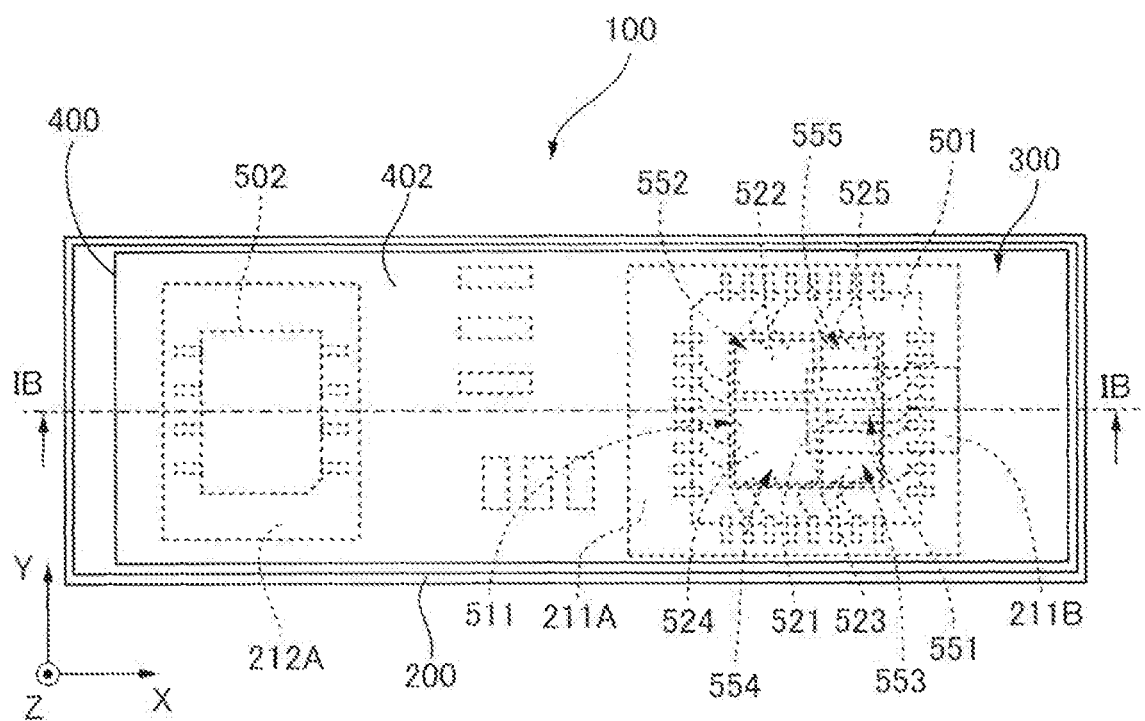
FIG. 1A is a plan view of a vehicle control device according to a first embodiment.
Figure 1B:
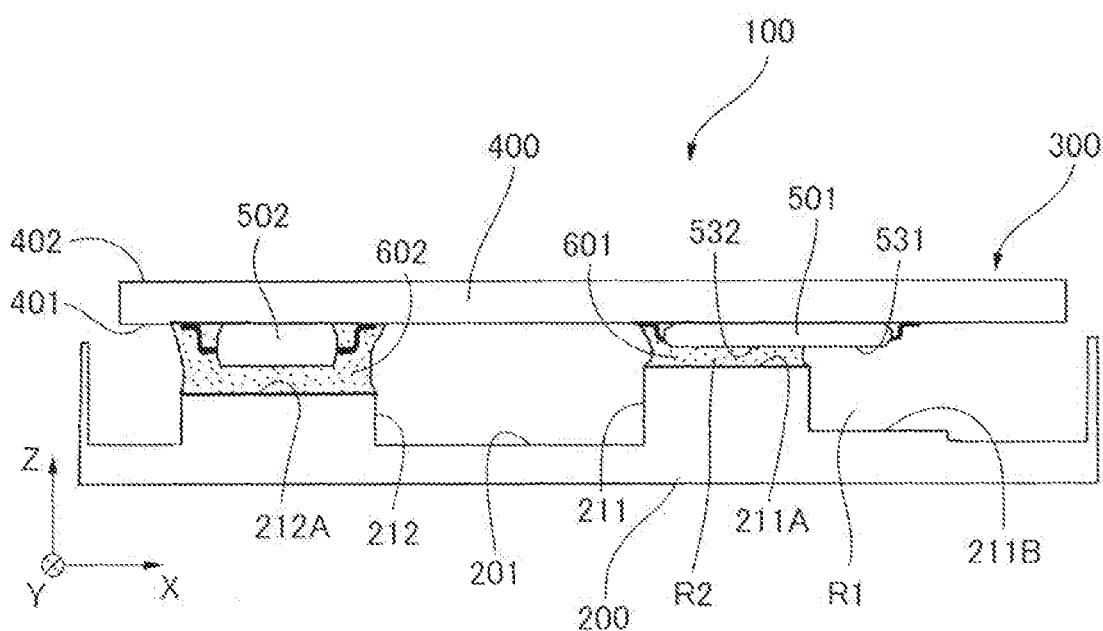
FIG. 1B is a sectional view of the vehicle control device taken along the line IB-IB of FIG. 1A.
Figure 3A:
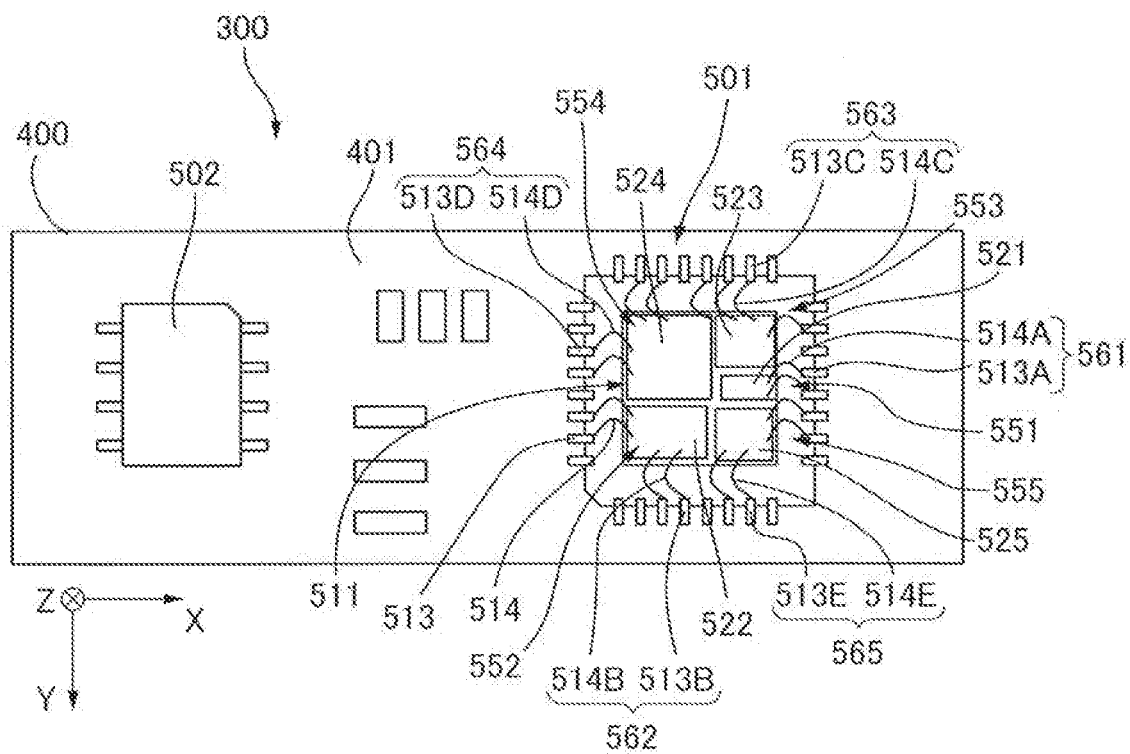
FIG. 3A is a plan view of a printed circuit board of the vehicle control device according to the first embodiment.
Figure 3B:
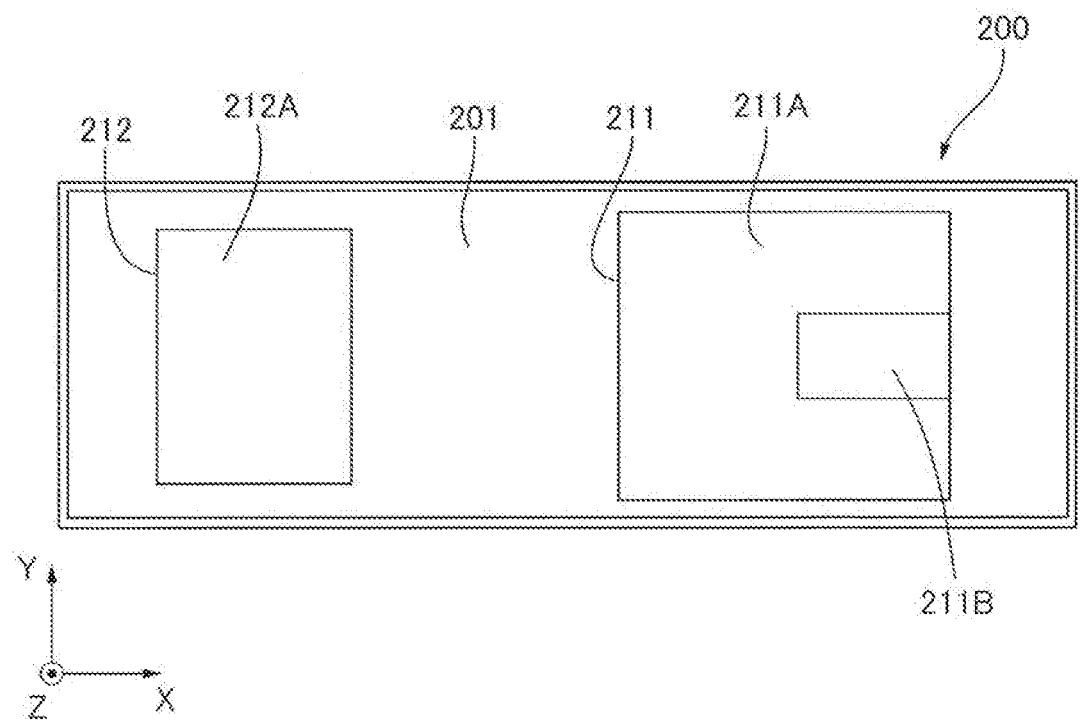
FIG. 3B is a plan view of a housing of the vehicle control device according to the first embodiment.

A vehicle control device according to a first embodiment will be described below. FIG. 1A is a plan view of the vehicle control device according to the first embodiment. FIG. 1B is a sectional view of the vehicle control device taken along the line IB-IB of FIG. 1A. FIG. 2 is an enlarged sectional view of a part of the vehicle control device according to the first embodiment illustrated in FIG. 1B. FIG. 3A is a plan view of a printed circuit board of the vehicle control device according to the first embodiment. FIG. 3B is a plan view of a housing of the vehicle control device according to the first embodiment.

A vehicle control device 100 illustrated in FIGS. 1A and 1B is mounted on a vehicle. The vehicle control device 100 is an ECU (Electronic Control Unit), for example. The vehicle control device 100 includes a housing 200 mounted on the vehicle and made of metal, e.g. aluminum, and a printed circuit board 300 housed in the housing 200.

The printed circuit board 300 has a substrate 400 which is a printed wiring board, and electronic components 501 and 502 mounted on the substrate 400. The electronic components 501 and 502 generate heat during operation.

The substrate 400 has a pair of mounting surfaces 401 and 402. The substrate 400 is a two-layer printed wiring board. The mounting surfaces 401 and 402 each serve as a conductor layer on which a conductor pattern is mainly disposed. As illustrated in FIG. 2, an insulator layer (dielectric layer) 403 is disposed between the mounting surfaces 401 and 402. The insulator layer 403 is a layer on which an insulator is mainly disposed. The mounting surfaces 401 and 402 are provided with a solder resist (not illustrated) that covers the conductor.

Here, a direction that is parallel to the mounting surface 401 of the substrate 400 is defined as the X direction, a direction that is orthogonal to the X direction and that is parallel to the mounting surface 401 of the substrate 400 is defined as the Y direction, and a direction that is perpendicular to the mounting surface 401 of the substrate 400 is defined as the Z direction.

The electronic components 501 and 502 are mounted on one of the mounting surfaces 401 and 402, namely the mounting surface 401.

An opening portion is formed in the housing 200 is formed with a, and the opening portion is blocked by a lid body (not illustrated), so that a housing space is formed. The printed circuit board 300 is disposed in the housing space of the housing 200. The substrate 400 is housed in the housing 200 such that the mounting surface 401 faces an inner surface 201 of the housing 200. In the first embodiment, the inner surface 201 of the housing 200 corresponds to the bottom surface of the housing 200.

As illustrated in FIG. 1B, an adhesive 601, which is a heat radiation material that conducts heat generated by the electronic component 501 to the housing 200, is disposed between the electronic component 501 and the inner surface 201 of the housing 200. An adhesive 602, which is a heat radiation material that conducts heat generated by the electronic component 502 to the housing 200, is disposed between the electronic component 502 and the mounting surface 401 of the substrate 400. That is, the electronic component 501 is bonded and fixed to the housing 200 by the adhesive 601, and the electronic component 502 is bonded and fixed to the housing 200 by the adhesive 602. In this way, the adhesives 601 and 602 also fix the electronic components 501 and 502 (that is, the printed circuit board 300) to the housing 200, in addition to radiating heat from the electronic components 501 and 502 to the housing 200.

The adhesives 601 and 602 contain a resin material as a base material and filler metal to enhance the thermal conductivity of the adhesives 601 and 602. This enhances the performance of heat radiation of the electronic components 501 and 502 to the housing 200. The housing 200 may be cooled through natural convection, or may be cooled by a cooling fan or the like.

The electronic component 501 is a semiconductor integrated circuit constituted of a semiconductor package, and is a microcomputer, for example. In the first embodiment, the electronic component 501 is a semiconductor package of a QFP (Quad Flat Package) type with a heat radiation plate.

As illustrated in FIG. 2, the electronic component 501 has a semiconductor chip 511, a die pad 512 that supports the semiconductor chip 511, a plurality of lead frames 513 that serve as terminals to be joined to the substrate 400 by a joint member 701 such as solder, a plurality of bonding wires 514 that connect the semiconductor chip 511 and the plurality of lead frames 513 to each other, and a sealing resin 515 that seals such components.

In the first embodiment, a surface 512B of the die pad 512 that is remote from a support surface 512A and supports the semiconductor chip 511 is exposed from the sealing resin 515. That is, the die pad 512 functions also as a heat radiation plate that radiates heat generated by the semiconductor chip 511. The surface 512B of the die pad 512 is joined to a land for heat radiation, that is, a conductor pattern, formed on the mounting surface 401 of the substrate 400 by a joint member 711 such as solder. Consequently, a part of heat generated by the electronic component 501 is radiated to the substrate 400.

The type of the semiconductor package which constitutes the electronic component 501 is not limited to the QFP, and may be any other type of semiconductor packages such as QFN, for example. The electronic component 501 has been described as having a heat radiation plate. However, the electronic component 501 may not have a heat radiation plate.

As illustrated in FIGS. 1A and 3A, the semiconductor chip 511 has a clock output circuit 521, a power supply circuit 522, a logic circuit 523, an analog circuit 524, and another circuit 525. The circuit 525 includes a semiconductor element that performs on/off operation in accordance with a switching signal. In FIG. 3A, a part of the sealing resin 515 of the electronic component 501 is not illustrated.

In the first embodiment, a lead frame 513A, of the plurality of lead frames 513, and the clock output circuit 521 are connected to each other by a bonding wire 514A. A lead frame 513B, of the plurality of lead frames 513, and the power supply circuit 522 are connected to each other by a bonding wire 514B. A lead frame 513C, of the plurality of lead frames 513, and the logic circuit 523 are connected to each other by a bonding wire 514C. A lead frame 513D, of the plurality of lead frames 513, and the analog circuit 524 are connected to each other by a bonding wire 514D. A lead frame 513E, of the plurality of lead frames 513, and the circuit 525E are connected to each other by a bonding wire 514E.

The lead frame 513A and the bonding wire 514A constitute wiring 561 that serves as a transmission path which is connected to the clock output circuit 521 and through which a clock signal is transmitted. The lead frame 513B and the bonding wire 514B constitute wiring 562 connected to the power supply circuit 522. The lead frame 513C and the bonding wire 514C constitute wiring 563 connected to the logic circuit 523. The lead frame 513D and the bonding wire 514D constitute wiring 564 connected to the analog circuit 524. The lead frame 513E and the bonding wire 514E constitute wiring 565 connected to the circuit 525.

The clock output circuit 521 outputs a clock signal to another circuit, e.g. the logic circuit 523, in the electronic component 501, or outputs a clock signal to another electronic component, e.g. the electronic component 502, mounted on the substrate 400 through the wiring 561. The logic circuit 523 is a circuit that operates in accordance with the clock signal.

Of the circuits 521 to 525, the clock output circuit 521 operates to generate the most electromagnetic noise in a predetermined frequency band, specifically a frequency band of 76 to 90 [MHz] which is an FM broadcast frequency band. The clock output circuit 521 generates electromagnetic noise at a level exceeding a threshold in the predetermined frequency band. Electromagnetic noise is generated also from the wiring 561 which is connected to the clock output circuit 521. A circuit portion 551, which serves as the first circuit portion, is constituted to include the clock output circuit 521 and the wiring 561.

Electromagnetic noise at a level exceeding a threshold in the predetermined frequency band, e.g. a frequency band of 76 to 90 [MHz] which is an FM broadcast frequency band, is generated also from the logic circuit 523 and the circuit 525. Electromagnetic noise is generated also from the wiring 563 which is connected to the logic circuit 523 and the wiring 565 which is connected to the circuit 525. In the first embodiment, a circuit portion 553, which serves as the first circuit portion, is constituted to include the logic circuit 523 and the wiring 563. A circuit portion 555, which serves as the first circuit portion, is constituted to include the circuit 525 and the wiring 565.

A circuit portion 552 which serves as the second circuit portion is constituted from the power supply circuit 522 and the wiring 562, and a circuit portion 554 which serves as the second circuit portion is constituted from the analog circuit 524 and the wiring 564.

That is, the circuit portions 551, 553, and 555 are noise radiation sources that radiate a larger amount of noise in the predetermined frequency band than the amount of noise radiated from the circuit portions 552 and 554. In particular, the clock output circuit 521 is a circuit that cyclically performs switching operation, that is, a circuit that cyclically repeatedly turns on and off, and cyclic noise is radiated as electromagnetic noise from the clock output circuit 521 and the wiring 561. Here, the term "cyclic" may mean either "regular cycles" or "irregular cycles". In the first embodiment, the term "cyclic" means "regular cycles". Noise radiated from the circuit portions 551, 553, and 554, which each serve as the first circuit portion, contains an integer times (n-th harmonic wave) the frequency at which the circuit repeatedly turns on and off.

In the description, electromagnetic noise radiated from the circuit portions 551, 553, and 555, which each serve as the first circuit portion, is larger in amount than electromagnetic noise radiated from the circuit portions 552 and 554, which each serve as the second circuit portion, in a frequency band of 76 to 90 [MHz] which is an FM broadcast frequency band. However, such a frequency band is not limiting. That is, the amount of noise radiated from the first circuit portion may be larger than the amount of noise radiated from the second circuit portion, that is, the amount of noise radiated from the first circuit portion may exceed a threshold, in a predetermined frequency band other than the FM broadcast frequency band. Specific examples of the frequency band include a frequency band of 0.5265 to 1.6065 [MHz], a frequency band of 5.9 to 6.2 [MHz], a frequency band 30 of 54 to [MHz], a frequency band of 76 to 90 [MHz], a frequency band of 142 to 170 [MHz], a frequency band of 335 to 470 [MHz], and a frequency band of 770 to 960 [MHz]. The predetermined frequency band in which the amount of noise from the first circuit portion is larger may be one or a plurality of such frequency bands. The frequency bands described above are merely a list of examples, and the predetermined frequency band in which the amount of noise radiated from the first circuit portion is larger is not limited to one of the listed frequency bands or a combination of frequency bands from the list. That is, the predetermined frequency band may be a frequency band with a different range from the frequency bands listed above. The amount of noise radiated from the first circuit portion may be larger than the amount of noise radiated from the second circuit portion over all frequencies, rather than in the specific frequency band.

The adhesive 601 has a higher dielectric constant (relative dielectric constant) than that of air. In the first embodiment, in particular, the adhesive 601 contains filler metal, and thus has a higher dielectric constant than that of an adhesive that does not contain filler metal.

As illustrated in FIG. 2, the electronic component 501 has a non-contact portion 531 that does not contact the adhesive 601 and a contact portion 532 that contacts the adhesive 601. The non-contact portion 531 and the contact portion 532 are surface portions of the electronic component 501 on the side facing the inner surface 201 of the housing 200. When seen in the Z direction, a region R1 which serves as the first region is present between the non-contact portion 531 and the inner surface 201, and a region R2 which serves as the second region is present between the contact portion 532 and the inner surface 201. That is, the adhesive 601 is not present in the region R1, and the adhesive 601 is disposed in the region R2.

When the vehicle control device 100 is seen in the Z direction, the circuit portions 551, 553, and 555, which are each a noise radiation source, are superposed on the non-contact portion 531, that is, the region R1. Specifically, the circuit portions 551, 553, and 555 are partially or wholly superposed on the non-contact portion 531 (region R1). In the first embodiment, as seen in the Z direction, the circuit portion 551 is wholly, and the circuit portions 553 and 555 are partially, superposed on the non-contact portion 531 (region R1) (FIG. 1A). In other words, a projection region obtained by projecting the circuit portions 551, 553, and 555 in the Z direction onto the XY plane which is parallel to the mounting surface 401 of the substrate 400 and a projection region obtained by projecting the non-contact portion 531 in the Z direction onto the XY plane are superposed on each other.

When the vehicle control device 100 is seen in the Z direction, the circuit portion 552 which has the power supply circuit 522 and the circuit portion 554 which has the analog circuit 524 are wholly superposed on the contact portion 532, that is, the region R2. In other words, a projection region obtained by projecting the circuit portions 552 and 554 in the Z direction onto the XY plane which is parallel to the mounting surface 401 of the substrate 400 and a projection region obtained by projecting the contact portion 532 in the Z direction onto the XY plane are superposed on each other. When the vehicle control device 100 is seen in the Z direction, the circuit portion 553 which has the logic circuit 523 and the circuit portion 555 which has the circuit 525 are partially superposed on the contact portion 532.

As illustrated in FIGS. 1B and 2, the region R1 between the non-contact portion 531 and the inner surface 201 of the housing 200 does not have the adhesive 601, and is a void. That is, a substance that is present in the region R1 is air. The dielectric constant (relative dielectric constant) of air is lower than the dielectric constant (relative dielectric constant) of the adhesive 601, and therefore the parasitic capacitance between the circuit portions 551, 553, and 555 and the housing 200 is reduced, which reduces propagation of electromagnetic noise radiated from the circuit portions 551, 553, and 555 to the housing 200. In particular, the circuit portion 551, which generates the most electromagnetic noise, is wholly superposed on the region R1, and therefore propagation of electromagnetic noise generated by the circuit portion 551 to the housing 200 can be reduced effectively. Consequently, propagation of noise from the housing 200 to electronic apparatuses etc. mounted on the vehicle can be reduced. Hence, the vehicle control device 100 can meet the international standard CISPR 25, for example.

The adhesive 601 has a higher thermal conductivity than that of air. Heat generated by the electronic component 501 is conducted to the housing 200 via the adhesive 601 which is provided between the contact portion 532 of the electronic component 501 and the housing 200, and thus the heat radiation performance for the electronic component 501 can be secured.

In the first embodiment, as illustrated in FIGS. 1B and 3B, projecting portions 211 and 212 that project in the +Z direction toward the electronic components 501 and 502 are formed on the inner surface 201 of the housing 200 at positions facing the electronic components 501 and 502, respectively.

The projecting portion 211 serves as a pedestal for the electronic component 501, and the projecting portion 212 serves as a pedestal for the electronic component 502. A recessed portion 211B recessed in the −Z direction away from the electronic component 501 is formed in a facing surface (distal end surface) 211A of the projecting portion 211, which faces the electronic component 501, at a position facing the non-contact portion 531. The electronic component 501 is bonded to the facing surface 211A of the projecting portion 211 using the adhesive 601. The electronic component 502 is bonded to a facing surface 212A of the projecting portion 212, which faces the electronic component 502, using the adhesive 602.

In the first embodiment, when seen in the Z direction, as illustrated in FIG. 1A, the non-contact portion 531 which is not contacted by the adhesive 601 is superposed on the recessed portion 211B. In other words, a projection region obtained by projecting the non-contact portion 531 in the Z direction onto the XY plane is superposed on a projection region obtained by projecting the recessed portion 211B in the Z direction onto the XY plane. Hence, a distance L1 (FIG. 2) in the Z direction between the non-contact portion 531 and the inner surface 201 of the housing 200 in the region R1 is longer than a distance L2 (FIG. 2) in the Z direction between the contact portion 532 and the inner surface 201 of the housing 200 in the region R2.

Consequently, the circuit portions 551, 553, and 555 which are noise radiation sources of the electronic component 501, particularly the circuit portion 551, are located away from the housing 200. Thus, the parasitic capacitance between the circuit portions 551, 553, and 555 and the housing 200 is reduced, which reduces propagation of electromagnetic noise radiated from the circuit portions 551, 553, and 555 to the housing 200. Hence, propagation of noise from the housing 200 to electronic apparatuses etc. mounted on the vehicle can be reduced.

Second Embodiment

Figure 4:
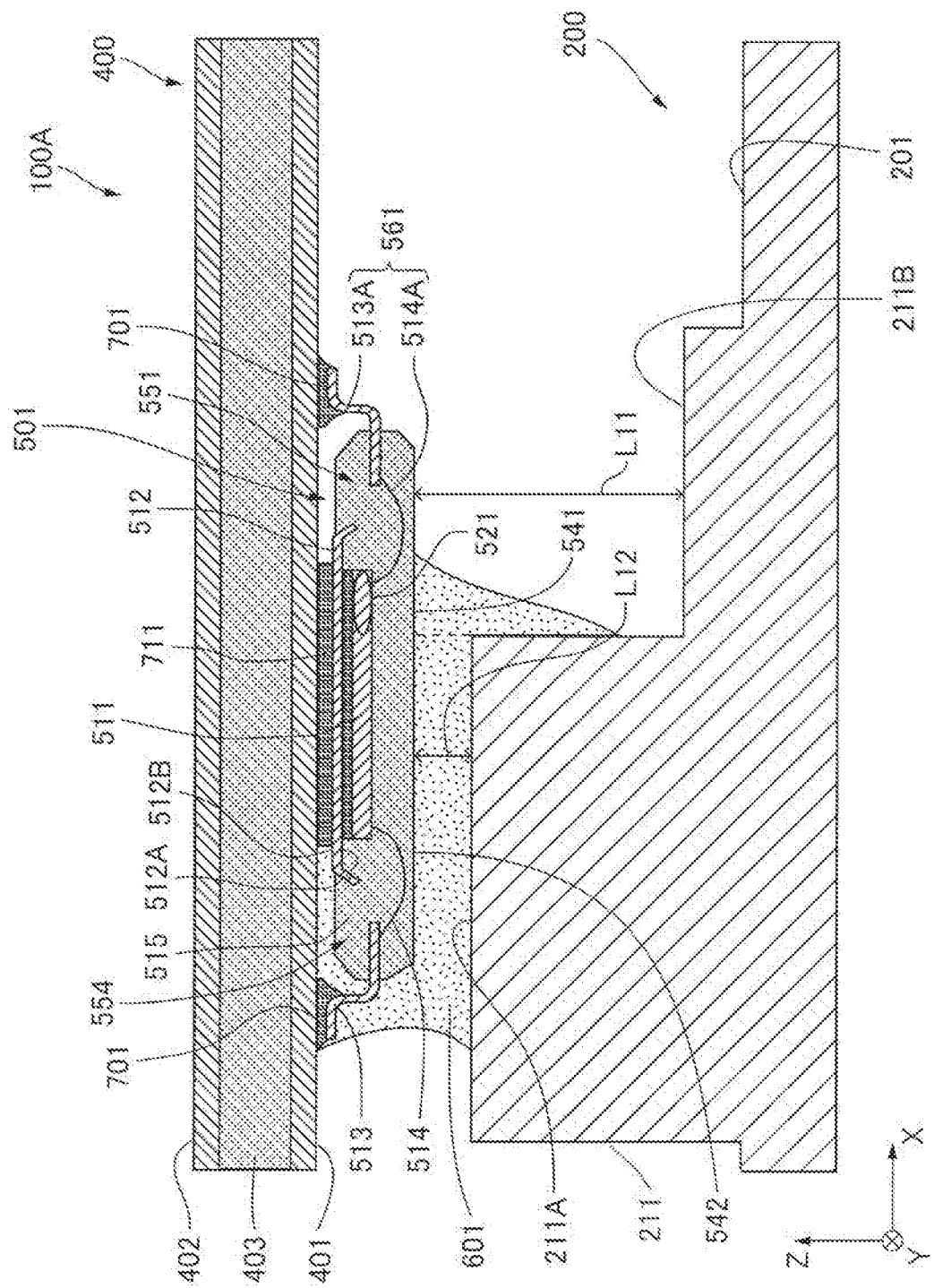
FIG. 4 is an enlarged sectional view of a part of a vehicle control device according to a second embodiment.

A vehicle control device according to a second embodiment will be described. FIG. 4 is an enlarged sectional view of a part of the vehicle control device according to the second embodiment. Components of a vehicle control device 100A according to the second embodiment that are similar to those of the vehicle control device 100 according to the first embodiment are given the same reference numerals to omit description. In the vehicle control device 100A according to the second embodiment, the application amount of the adhesive 601 is different from that in the first embodiment. That is, in the second embodiment, the adhesive 601 protrudes into the recessed portion 211B. That is, the recessed portion 211B acts also as a clearance portion for the adhesive 601 which has been applied excessively.

The electronic component 501 has a surface portion 541, which serves as the first portion, and a surface portion 542, which serves as the second portion, other than the surface portion 541. The surface portions 541 and 542 are surface portions of the electronic component 501 on the side facing the inner surface 201 of the housing 200. The electronic component 501 has the circuit portion 551 which is disposed so as to be superposed on the surface portion 541 as seen in the Z direction, and the circuit portion 554 which is disposed so as to be superposed on the surface portion 542. As described in relation to the first embodiment, the circuit portion 551 radiates a larger amount of noise in the predetermined frequency band, e.g. a frequency band of 76 to 90 [MHz] which is an FM broadcast frequency band, than the amount of noise radiated from the circuit portion 554. The circuit portion 551 is disposed so as to be partially or wholly, and wholly in the second embodiment, superposed on the surface portion 541 as seen in the Z direction. The circuit portion 554 is wholly superposed on the surface portion 542 as seen in the Z direction.

As in the first embodiment, the projecting portion 211 which projects in the +Z direction is formed on the inner surface 201. The recessed portion 211B which is recessed in the −Z direction away from the electronic component 501 is formed in the facing surface 211A of the projecting portion 211 at a position facing the surface portion 541 of the electronic component 501. That is, the surface portion 541 of the electronic component 501 faces the recessed portion 211B in the Z direction, and the surface portion 542 of the electronic component 501 faces the facing surface 211A (excluding the recessed portion 211B) in the Z direction. Thus, a distance L11 in the Z direction between the surface portion 541 of the electronic component 501 and the inner surface 201 of the housing 200 is longer than a distance L12 in the Z direction between the surface portion 542 of the electronic component 501 and the inner surface 201 of the housing 200.

With the second embodiment, the circuit portion 551 of the electronic component 501 is located away from the housing 200 since the distance L11 is longer than the distance L12, even if the adhesive 601 is provided between the surface portion 541 of the electronic component 501 and the inner surface 201 of the housing 200, and the parasitic capacitance between the circuit portion 551 and the housing 200 is reduced, which reduces propagation of electromagnetic noise radiated from the circuit portion 551 to the housing 200. Consequently, propagation of noise from the housing 200 to electronic apparatuses etc. mounted on the vehicle can be reduced. Hence, the vehicle control device 100A can meet the international standard CISPR 25, for example.

Heat generated by the electronic component 501 is conducted to the housing 200 via the adhesive 601 which is provided between the electronic component 501 and the housing 200, and thus the heat radiation performance for the electronic component 501 can be secured.

An extra amount of the adhesive 601 applied flows to the recessed portion 211B, and therefore the amount of the adhesive 601 which contacts the surface portion 541 is reduced, which reduces the parasitic capacitance between the circuit portion 551 and the housing 200.

Third Embodiment

A vehicle control device according to a third embodiment will be described. FIG. 5 is an enlarged sectional view of a part of the vehicle control device according to the third embodiment. Components of a vehicle control device 100B according to the third embodiment that are similar to those of the vehicle control device 100 according to the first embodiment and the vehicle control device 100A according to the second embodiment are given the same reference numerals to omit description. In the first embodiment, the recessed portion 211B is formed in the facing surface 211A of the projecting portion 211 at a position facing the non-contact portion 531. In the third embodiment, the recessed portion 211B is not formed in the facing surface 211A, and the distance L1 between the non-contact portion 531 and the inner surface 201 (facing surface 211A) of the housing 200 in the region R1 is equal to the distance L2 between the contact portion 532 and the inner surface 201 (facing surface 211A) of the housing 200 in the region R2. While the electronic component 501 is bonded to the projecting portion 211, the electronic component 501 may be bonded to a location other than the projecting portion 211.

In FIG. 5, when the vehicle control device 100B is seen in the Z direction, the circuit portion 551, which is a noise radiation source, is superposed on the non-contact portion 531. Specifically, the circuit portion 551 is partially or wholly, and wholly in the third embodiment, superposed on the non-contact portion 531 as seen in the Z direction. In other words, a projection region obtained by projecting the circuit portion 551 in the Z direction onto the XY plane which is parallel to the mounting surface 401 of the substrate 400 and a projection region obtained by projecting the non-contact portion 531 in the Z direction onto the XY plane are superposed on each other. The circuit portion 554 is wholly superposed on the contact portion 532 as seen in the Z direction.

The region R1 between the non-contact portion 531 and the housing 200 does not have the adhesive 601, and is a void. Air has a lower dielectric constant (relative dielectric constant) than the dielectric constant (relative dielectric constant) of the adhesive 601. Therefore, the parasitic capacitance between the circuit portion 551 and the housing 200 is reduced. Thus, propagation of electromagnetic noise radiated from the circuit portion 551 to the housing 200 can be reduced even if the distance L1 is equal to the distance L2. Consequently, propagation of noise from the housing 200 to electronic apparatuses etc. mounted on the vehicle can be reduced. Hence, the vehicle control device 100B can meet the international standard CISPR 25, for example.

Heat generated by the electronic component 501 is conducted to the housing 200 via the adhesive 601 which is provided between the contact portion 532 of the electronic component 501 and the housing 200, and thus the heat radiation performance for the electronic component 501 can be secured.

SUMMARY OF EMBODIMENTS

An embodiment provides a vehicle control device (100, 100B) including:
a housing (200) mounted on a vehicle and made of metal;
a substrate (400) housed in the housing (200) and having a mounting surface (401) that faces an inner surface (201) of the housing (200);
an electronic component (501) mounted on the mounting surface (401); and
a heat radiation material (601) disposed between the electronic component (501) and the inner surface (201) of the housing (200), in which:
the electronic component (501) has a contact portion (532) that contacts the heat radiation material (601) and a non-contact portion (531) that does not contact the heat radiation material (601), the contact portion (532) and the non-contact portion (531) being portions of the electronic component (501) on a side facing the inner surface (201) of the housing (200).

Consequently, it is possible to reduce propagation of electromagnetic noise radiated from the electronic component (501) to the housing (200) while securing the heat radiation performance for the electronic component (501).

In the vehicle control device (100, 100B) according to the embodiment,
the electronic component (501) has a first circuit portion (551, 553, 555) and a second circuit portion (552, 554); and
the first circuit portion (551, 553, 555) radiates a larger amount of noise than an amount of noise radiated from the second circuit portion (552, 554), and is superposed on the non-contact portion (531) as seen in a direction (Z direction) that is perpendicular to the mounting surface (401).

Consequently, it is possible to effectively reduce conduction of electromagnetic noise radiated from the first circuit portion (551, 553, 555) to the housing (200).

In the vehicle control device (100) according to the embodiment, a distance (L1) between the non-contact portion (531) and the inner surface (201) of the housing (200) in the perpendicular direction (Z direction) is longer than a distance (L2) between the contact portion (532) and the inner surface (201) of the housing (200) in the direction (Z direction) which is perpendicular to the mounting surface (401).

Consequently, it is possible to reduce propagation of electromagnetic noise radiated from the electronic component (501) to the housing (200) while securing the heat radiation performance for the electronic component (501).

In the vehicle control device (100) according to the embodiment, the inner surface (201) of the housing (200) has a recessed portion (211B) disposed at a position facing the non-contact portion (531) and recessed in a direction away from the electronic component (50).

Consequently, heat generated by the electronic component (501) is conducted to the inner surface (211) of the housing (200), which secures the heat radiation performance for the electronic component (501), and conduction of electromagnetic noise radiated from the electronic component (501) to the housing (200) can be effectively reduced by the recessed portion (211B).

An embodiment provides a vehicle control device (100, 100B) including:

a housing (200) mounted on a vehicle and made of metal;

a substrate (400) housed in the housing (200) and having a mounting surface (401) that faces an inner surface (201) of the housing (200);

an electronic component (501) mounted on the mounting surface (401); and a heat radiation material (601) disposed in a second region (R2), of a first region (R1) and the second region (R2) between the electronic component (501) and the inner surface (201) of the housing (200) as seen in a direction (Z direction) that is perpendicular to the mounting surface (401), in which a dielectric constant of a substance that is present in the first region (R1) is lower than a dielectric constant of the heat radiation material (601).

Consequently, it is possible to reduce propagation of electromagnetic noise radiated from the electronic component (501) to the housing (200) while securing the heat radiation performance for the electronic component (501).

In the vehicle control device (100) according to the embodiment, a distance (L1) between the electronic component (501) and the inner surface (201) of the housing (200) in the direction (Z direction) that is perpendicular to the mounting surface (401) in the first region (R1) is longer than a distance (L2) between the electronic component (501) and the inner surface (201) of the housing (200) in the direction (Z direction) which is perpendicular to the mounting surface (401) in the second region (R2).

Consequently, it is possible to further effectively reduce propagation of electromagnetic noise radiated from the electronic component (501) to the housing (200).

In the vehicle control device (100) according to the embodiment, the inner surface (201) of the housing (200) has a recessed portion (211B) disposed in a portion facing the first region (R1) and recessed in a direction (−Z direction) away from the electronic component (501).

Consequently, heat generated by the electronic component (501) is conducted to the inner surface (211), which secures the heat radiation performance for the electronic component (501), and conduction of electromagnetic noise radiated from the electronic component (501) to the housing (200) can be effectively reduced by the recessed portion (211B).

In the vehicle control device (100B) according to the embodiment, a distance (L1) between the electronic component (501) and the inner surface (201) of the housing (200) in the direction (Z direction) which is perpendicular to the mounting surface (401) in the first region (R1) is equal to a distance (L2) between the electronic component (501) and the inner surface (201) of the housing (200) in the direction (Z direction) which is perpendicular to the mounting surface (401) in the second region (R2).

Consequently, it is possible to effectively reduce propagation of electromagnetic noise radiated from the electronic component (501) to the housing (200).

In the vehicle control device (100, 100B) according to the embodiment, the substance which is present in the first region (R1) is air.

Consequently, it is possible to effectively reduce propagation of electromagnetic noise radiated from the electronic component (501) to the housing (200).

In the vehicle control device (100, 100B) according to the embodiment, the substance which is present in the first region (R1) is a heat radiation material that is different from the heat radiation material (601) and that has a dielectric constant that is lower than that of the heat radiation material (601) and a thermal conductivity that is lower than that of the heat radiation material (601).

Consequently, it is possible to effectively reduce propagation of electromagnetic noise radiated from the electronic component (501) to the housing (200).

An embodiment provides a vehicle control device (100A) including:

a housing (200) mounted on a vehicle and made of metal;

a substrate (400) housed in the housing (200) and having a mounting surface (401) that faces an inner surface (201) of the housing (200);

an electronic component (501) mounted on the mounting surface (401); and a heat radiation material (601) disposed between the electronic component (501) and the inner surface (201) of the housing (200), in which:

the electronic component (501) has a first portion (541) and a second portion (542) on a side facing the inner surface (201) of the housing (200); and a distance (L11) between the first portion (541) and the inner surface (201) of the housing (200) in a direction (Z direction) that is perpendicular to the mounting surface (401) is longer than a distance (L12) between the second portion (542) and the inner surface (201) of the housing (200) in the direction (Z direction) which is perpendicular to the mounting surface (401).

Consequently, it is possible to reduce propagation of electromagnetic noise radiated from the electronic component (501) to the housing (200) while securing the heat radiation performance for the electronic component (501).

In the vehicle control device (100A) according to the embodiment, the inner surface (201) of the housing (200) has a recessed portion (211B) disposed at a position facing the first portion (541) and recessed in a direction (−Z direction) away from the electronic component (501).

Consequently, heat generated by the electronic component (501) is conducted to the inner surface (211) of the housing (200), which secures the heat radiation performance for the electronic component (501), and conduction of electromagnetic noise radiated from the electronic component (501) to the housing (200) can be effectively reduced by the recessed portion (211B).

In the vehicle control device (100, 100B) according to the embodiment, the electronic component (501) has a first circuit portion (551, 553, 555) disposed so as to be partially or wholly superposed on the first region (R1) and a second circuit portion (552, 554) disposed so as to be wholly superposed on the second region (R2), as seen in the direction (Z direction) which is perpendicular to the mounting surface (401).

Consequently, it is possible to effectively reduce conduction of electromagnetic noise radiated from the first circuit portion (551, 553, 555) to the housing (200).

In the vehicle control device (100A) according to the embodiment, the electronic component (501) has a first circuit portion (551) disposed so as to be partially or wholly superposed on the first portion (541) and a second circuit portion (554) disposed so as to be wholly superposed on the second portion (542), as seen in the direction (Z direction) which is perpendicular to the mounting surface (401).

Consequently, it is possible to effectively reduce conduction of electromagnetic noise radiated from the first circuit portion (551) to the housing (200).

In the vehicle control device (100, 100A, 100B) according to the embodiment, the first circuit portion (551, 553, 555) radiates a larger amount of noise in a predetermined frequency band than an amount of noise radiated from the second circuit portion (552, 554).

Consequently, it is possible to effectively reduce conduction of electromagnetic noise radiated from the first circuit portion (551, 553, 555), which radiates a large amount noise, to the housing (200).

In the vehicle control device (100, 100A, 100B) according to the embodiment, the first circuit portion (551, 553, 555) includes a circuit (521, 523, 525) that cyclically performs switching operation.

Consequently, it is possible to effectively reduce conduction of electromagnetic noise radiated from the circuit (521, 523, 525) of the first circuit portion (551, 553, 555), which radiates noise that peaks at a specific frequency, to the housing (200).

In the vehicle control device (100, 100A, 100B) according to the embodiment, the first circuit portion (551, 553, 555) includes wiring (561, 563, 565) connected to a circuit that cyclically performs switching operation.

Consequently, it is possible to effectively reduce conduction of electromagnetic noise radiated from the wiring (561, 563, 565) for the first circuit portion (551, 553, 555), which radiates noise that peaks at a specific frequency, to the housing (200).

In the vehicle control device (100, 100A, 100B) according to the embodiment, the circuit which cyclically performs switching operation is a clock output circuit (521) that outputs a clock signal, a circuit (523) that operates in accordance with a clock signal, or a circuit (525) that includes a semiconductor element that performs on/off operation in accordance with a switching signal.

Consequently, it is possible to effectively reduce conduction of electromagnetic noise due to operation of the clock output circuit (521), the circuit (523), or the semiconductor element (525) to the housing (200).

In the vehicle control device (100, 100A, 100B) according to the embodiment, the heat radiation material is an adhesive (601) that bonds the electronic component (501) to the housing (200).

Consequently, heat generated by the electronic component (501) can be conducted to the housing (200) via the adhesive (601) while fixing the electronic component (501) to the housing 200 using the adhesive (601).

In the vehicle control device (100, 100A, 100B) according to the embodiment, the heat radiation material (601) contains filler metal.

Consequently, the thermal conductivity of the heat radiation material is enhanced, and the heat radiation performance for the electronic component (501) is improved.

Possibility of Other Embodiments

In the first to third embodiments described above, the electronic component 501 is a microcomputer of an ECU. However, the present invention is not limited thereto. The electronic component 501 may be any electronic component that controls an in-vehicle device mounted on a vehicle, that controls a different electronic component disposed in the housing 200, or the like. For example, the electronic component 501 may be a driver IC that has a semiconductor element such as a MOS-FET that repeatedly performs on/off operation in the cycle of a PWM signal that serves as a switching signal. In this case, the semiconductor element or wiring for the semiconductor element serves as the first circuit portion which is a noise radiation source.

Alternatively, the electronic component 501 may be a switching power supply IC that has a clock output circuit or a circuit that includes a semiconductor element that performs on/off operation in accordance with a switching signal, for example. In this case, the first circuit portion may be a circuit portion that has the clock output circuit or wiring for the clock output circuit, or may be a circuit portion that has the circuit which includes the semiconductor element or wiring for the circuit.

In the first to third embodiments, the circuit portions 551, 553, and 555 radiate much electromagnetic noise in a frequency band of 76 to 90 [MHz] which is an FM broadcast frequency band, and therefore the predetermined frequency band in which noise propagation is to be reduced is a frequency band of 76 to 90 [MHz]. However, such a frequency band is not limiting. That is, the amount of noise radiated from the first circuit portion may be larger than the amount of noise radiated from the second circuit portion, that is, the amount of noise radiated from the first circuit portion may exceed a threshold, in a predetermined frequency band other than the FM broadcast frequency band. Specifically, the first to third embodiments are suitable in the case where the predetermined frequency band is any one of a frequency band of 0.5265 to 1.6065 [MHz], a frequency band of 5.9 to 6.2 [MHz], a frequency band 30 of 54 to [MHz], a frequency band of 76 to 90 [MHz], a frequency band of 142 to 170 [MHz], a frequency band of 335 to 470 [MHz], and a frequency band of 770 to 960 [MHz].

In the first to third embodiments, the heat radiation material is the adhesive 601. However, the present invention is not limited thereto. For example, the heat radiation material may be heat radiation grease, a heat radiation sheet, etc. In the description, the substance which is present in the region R1 is air which has a lower dielectric constant than that of the heat radiation material. However, the substance which is present in the region R1 is not limited to air, and may be a substance other than air that has a lower dielectric constant than that of the heat radiation material.

In the first to third embodiments, the circuit portion 551 which is a noise radiation source is the clock output circuit 521 and the wiring 530. However, the present invention is not limited thereto, and the circuit portion 551 may be the clock output circuit 521 alone or the wiring 561 alone. Similarly, the circuit portion 553 may be the circuit 523 alone or the wiring 563 alone, and the circuit portion 555 may be the circuit 525 alone or the wiring 565 alone.

In the first to third embodiments, the substrate 400 is a two-layer printed wiring board. However, the substrate 400 is not limited to having two layers, and the substrate 400 may be a printed wiring board with one layer or three or more layers.

In the first to third embodiments, the substance which is present in the region R1 is air. However, the present invention is not limited thereto. The substance which is present in the first region R1 may be a heat radiation material of a different material that has a lower dielectric constant than that of the adhesive 601 which is present in the region R2 and a lower thermal conductivity than that of the adhesive 601. For example, the substance which is present in the first region R1 may be an adhesive of a different material from that of the adhesive 601. That is, adhesives may be present in both the region R1 and the region R2. In this case, it is only necessary that the adhesive 601 in the region R2 should have a higher thermal conductivity (heat radiation performance) and a higher dielectric constant than those of the adhesive in the region R1.

INDUSTRIAL APPLICABILITY

The present vehicle control device is suitably used when it is requested to reduce propagation of electromagnetic noise radiated from an electronic component to a housing while securing the heat radiation performance for the electronic component.

DESCRIPTION OF THE REFERENCE NUMERALS

100 VEHICLE CONTROL DEVICE
200 HOUSING
201 INNER SURFACE
211b RECESSED PORTION
400 SUBSTRATE
401 MOUNTING SURFACE
501 ELECTRONIC COMPONENT
531 NON-CONTACT PORTION
532 CONTACT PORTION
541 SURFACE PORTION (FIRST PORTION)
542 SURFACE PORTION (SECOND PORTION)
551, 553, 555 CIRCUIT PORTION (FIRST CIRCUIT PORTION)
552, 554 CIRCUIT PORTION (SECOND CIRCUIT PORTION)
601 ADHESIVE (HEAT RADIATION MATERIAL)
R1 REGION (FIRST REGION)
R2 REGION (SECOND REGION)

The invention claimed is:

1. A vehicle control device comprising:
a housing mounted on a vehicle and made of metal;
a substrate housed in the housing and having a mounting surface that faces an inner surface of the housing;
an electronic component mounted on the mounting surface; and
a heat radiation material disposed between the electronic component and the inner surface of the housing, wherein
the electronic component has a contact portion that contacts the heat radiation material and a non-contact portion that does not contact the heat radiation material, the contact portion and the non-contact portion being portions of the electronic component on a side facing the inner surface of the housing;
the electronic component has a first circuit portion and a second circuit portion;
the first circuit portion radiates a larger amount of noise than an amount of noise radiated from the second circuit portion, and is superposed on the non-contact portion as seen in a direction that is perpendicular to the mounting surface; and
a distance between the non-contact portion and the inner surface of the housing in a direction that is perpendicular to the mounting surface is longer than a distance between the contact portion and the inner surface of the housing in the perpendicular direction.

2. The vehicle control device according to claim 1, wherein
the inner surface of the housing has a recessed portion disposed at a position facing the non-contact portion and recessed in a direction away from the electronic component.

3. The vehicle control device according to claim 1, wherein
the heat radiation material is an adhesive that bonds the electronic component to the housing.

4. The vehicle control device according to claim 1, wherein
the heat radiation material contains filler metal.

5. A vehicle control device comprising:
a housing mounted on a vehicle and made of metal;
a substrate housed in the housing and having a mounting surface that faces an inner surface of the housing;
an electronic component mounted on the mounting surface; and
a heat radiation material disposed in a second region, of a first region and the second region between the electronic component and the inner surface of the housing as seen in a direction that is perpendicular to the mounting surface, wherein
a dielectric constant of a substance that is present in the first region is lower than a dielectric constant of the heat radiation material,
the electronic component has a first circuit portion and a second circuit portion;
the first circuit portion radiates a larger amount of noise than an amount of noise radiated from the second circuit portion, and is superposed on the non-contact portion as seen in a direction that is perpendicular to the mounting surface; and
a distance between the electronic component and the inner surface of the housing in the direction that is perpendicular to the mounting surface in the first region is longer than a distance between the electronic component and the inner surface of the housing in the direction which is perpendicular to the mounting surface in the second region.

6. The vehicle control device according to claim 5, wherein
the inner surface of the housing has a recessed portion disposed in a portion facing the first region and recessed in a direction away from the electronic component.

7. The vehicle control device according to claim 5, wherein the substance which is present in the first region is air.

8. The vehicle control device according to claim 5, wherein
the substance which is present in the first region is a heat radiation material that is different from the heat radiation material and that has a dielectric constant that is lower than that of the heat radiation material and a thermal conductivity that is lower than that of the heat radiation material.

9. The vehicle control device according to claim 5, wherein
the electronic component has a first circuit portion disposed so as to be partially or wholly superposed on the first region and a second circuit portion disposed so as to be wholly superposed on the second region, as seen in the direction which is perpendicular to the mounting surface.

\* \* \* \* \*